(12) United States Patent
Sano et al.

(10) Patent No.: US 8,039,182 B2
(45) Date of Patent: Oct. 18, 2011

(54) CIRCUIT PATTERN FORMATION DEVICE AND METHOD OF FORMING CIRCUIT PATTERN TO SUBSTRATE

(75) Inventors: Yuichiro Sano, Mito (JP); Toru Miyasaka, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 1019 days.

(21) Appl. No.: 11/772,867

(22) Filed: Jul. 3, 2007

(65) Prior Publication Data

US 2008/0044749 A1 Feb. 21, 2008

(30) Foreign Application Priority Data

Jul. 5, 2006 (JP) .................................. 2006-185072

(51) Int. Cl.
*G03G 13/04* (2006.01)
(52) U.S. Cl. .............................. 430/48; 430/34; 430/45.2
(58) Field of Classification Search .................... 430/34, 430/45.2, 48; 347/103, 112, 113; 428/40.9, 428/42.3; 399/237
See application file for complete search history.

(56) References Cited

U.S. PATENT DOCUMENTS

| 5,641,597 | A | * | 6/1997 | Ushio et al. ................ 430/31 |
| 7,556,850 | B2 | * | 7/2009 | Ikishima et al. ............ 428/41.5 |
| 2005/0153249 | A1 | | 7/2005 | Yamaguchi et al. | |

FOREIGN PATENT DOCUMENTS

| JP | 57-36890 | 2/1982 |
| JP | 2004-247572 | 9/2004 |
| JP | 2005-203396 | 7/2005 |
| JP | 2005-347571 | 12/2005 |

* cited by examiner

*Primary Examiner* — Thorl Chea
(74) *Attorney, Agent, or Firm* — Antonelli, Terry, Stout & Kraus, LLP.

(57) ABSTRACT

An object is to improve the adhesion strength between a circuit pattern and its substrate without increasing the resistance value of the circuit pattern in preparation of a circuit pattern holding substrate. A circuit pattern formation device 100 forms, after forming a precursor circuit-pattern 12 in the surface of a dielectric thin film body 4, a circuit pattern 14 onto a target substrate 23 from the dielectric thin film body. After forming an electrostatic latent image 2 in the upper surface of the dielectric thin film body, the electrostatic latent image is exposed using an exposure unit 3 to prepare a pattern. A development apparatus 7 supplies a conductive particle dispersion solution 6 to this pattern to form a precursor circuit-pattern. By energizing the circuit pattern holding substrate 8, in which an adhesive layer 22 is formed, the precursor circuit-pattern is temporarily transferred to the circuit pattern holding substrate. The transferred precursor circuit-pattern is heated using the heater 13 to form a circuit pattern. The circuit pattern and the adhesive layer are released from the circuit pattern holding substrate, thereby transferring to the target substrate.

13 Claims, 3 Drawing Sheets

CIRCUIT PATTERN FORMATION DEVICE AND METHOD OF FORMING CIRCUIT PATTERN TO SUBSTRATE

FIELD OF THE INVENTION

The present invention relates to a circuit pattern formation device for forming a circuit pattern to a printed circuit board and the like, and methods of forming a circuit pattern thereto.

BACKGROUND OF THE INVENTION

In the past, methods of forming a circuit pattern by printing processes, such as screen printing, a dispenser method, ink jet printing, and electrophotographic printing, have been often used because the circuit pattern can be formed conveniently. In these methods of forming a circuit pattern, a conductive microparticle dispersion liquid made by dispersing conductive particles into a solvent, or a toner made by containing conductive material into a resin is used. Then, a target pattern is formed by coating or by electrostatic adsorption, and is heated and burned and thereafter the particles are fused to each other to be conductive, thereby forming wirings.

An example of forming a circuit pattern in a substrate surface is described in Patent Document 1. In the method of forming a wiring board described in this official gazette, in order to reduce disconnections of the conductor wirings formed from a conductive ink, or delamination from a substrate, a substrate containing a resin composition, which exhibits adhesive properties for the conductor wiring after undergoing a predetermined temperature history, is prepared, and a conductive ink is applied to the surface of this substrate. Then, the substrate and the conductive film pattern formed from the conductive ink are heated and cooled based on the predetermined temperature history, thereby providing adhesive properties to the substrate. Accordingly, the conductive film pattern is converted into the conductor wiring.

Another example of forming a circuit pattern in a substrate surface is described in Patent Document 2. In the method of forming a wiring pattern described in this official gazette, in order to prepare a wiring pattern in various substrate materials with high drawing accuracy, a release layer is formed in the transfer sheet surface of a highly heat resistant and flexible film. Then, in the surface of this release layer, a fine wiring pattern is drawn with a metal nano particle dispersion liquid by screen printing or ink jet printing. Then, the wiring pattern is heated and burned. On the other hand, an adhesive layer is applied onto the substrate to be transferred, and the transfer sheet is adhered thereon and is then compression-bonded to each other and heated, so that the wiring pattern is transferred to the substrate to be transferred.
Patent Document 1 JP-A-2005-347571
Patent Document 2 JP-A-2004-247572

BRIEF SUMMARY OF THE INVENTION

Because the methods of forming a circuit pattern by the above-described printing processes neither use a resist nor include an etching process, these are advantageous in terms of material utilization efficiency. However, with the conductive ink and toner, which are wiring forming materials, in order to provide adhesive properties to the substrate, a resin component is dispersed into the ink in case of the ink, and a conductive material is contained into a resin in case of the toner. Because the ink or toner is heated and burned after the pattern formation, the resin component contained in the ink or in the toner increases the resistance value of the conductor when making the circuit pattern conductive by heating and burning the particles.

Moreover, in the method of forming a circuit pattern in the substrate surface described in Patent Document 1, after forming a conductive particle pattern on a target substrate, this target substrate has to be heated and burned to at least about 150° C. to 200° C., and thus the target substrate is limited to the ones having heat resistance. Accordingly, the target substrates allowing for only low temperatures may not be used, thus increasing the cost and decreasing the flexibility to select the substrate.

In the method of forming a circuit pattern in the substrate surface described in Patent Document 2, a transfer sheet base material has to be released after adhering a wiring pattern onto a target substrate. As a result, the coating film of a silicone resin or of fluororesin needs to be formed in the surface of the transfer sheet, in which a circuit pattern is temporarily formed, so that the base material may be released easily. In the step of forming the circuit pattern on the transfer sheet, in the step of heating and burning the formed pattern, and in the step of adhering the transfer sheet onto the target substrate, the retention of the circuit pattern in the surface of the transfer sheet decreases. As a result, a fracture or delamination of the pattern may occur.

In addition, when an electrostatic transfer is used in patterning the wiring material into an electrostatic latent image by an electrostatic force, the thicker the thickness of the substrate or of the transfer sheet, the higher voltage needs to be applied, and thus the transfer voltage tends to be insufficient, causing a decrease in the transfer efficiency or a decrease in the resolution of a transferred image in this case. Moreover, if the target substrate is not of a sheet shape but of a bulk body, it is physically impossible to apply the transfer voltage from the back side.

The present invention has been made in view of the problems in the above-described conventional arts, and an object of the invention is to improve the adhesion strength between a circuit pattern and its substrate without increasing the resistance value of the circuit pattern. Another object of the present invention is to allow a high resolution circuit pattern to be formed highly efficiently only by the application of a low voltage in the electrophotographic method. Yet another object of the present invention is to allow a circuit pattern to be formed in a poorly heat resistant substrate.

Other objects, features and advantages of the invention will become apparent from the following description of the embodiments of the invention taken in conjunction with the accompanying drawings.

DESCRIPTION OF REFERENCE NUMERALS

1 Charging device, 2 Electrostatic latent image, 3 Exposure unit, 4 Dielectric thin film body, 5 Electrostatic latent image pattern, 6 Particle dispersion solution, 7 Development apparatus, 8 Circuit pattern holding substrate, 9 Conveying roller, 10 Residual latent image erasing device, 11 Residual conductive particle cleaning device, 12 Precursor circuit-pattern, 13 Heater, 14 Circuit pattern, 15 Nonpolar solvent, 16 Ionic organic molecule, 17 Conductive particle, 18 Inorganic ion, 19 Fatty acid ion, 20 Base substrate, 21 Conductive base layer, 22 Adhesive layer, 23 Target substrate, 24 Adhesive agent

DETAILED DESCRIPTION OF THE INVENTION

According to an aspect of the present invention for attaining the above-described objects, in a circuit pattern formation method for forming a circuit pattern onto a target substrate from a member, in which a precursor circuit-pattern is formed in advance, the precursor circuit-pattern formed in the member is temporally transferred to a circuit pattern holding substrate, in an upper surface of which is formed an adhesive layer, and then the precursor circuit-pattern and the adhesive layer are transferred from the circuit pattern holding substrate to a target substrate.

Here, it is preferable that the member is a dielectric thin film body, and the circuit pattern holding substrate includes a base material, a conductive base layer formed in an upper surface of this base material, and an adhesive layer formed in an upper surface of this conductive base layer, wherein in forming the precursor circuit-pattern, a conductive particle dispersion solution is supplied to the dielectric thin film body to form the precursor circuit-pattern, and the formed precursor circuit-pattern is energized to be transferred to the circuit pattern holding substrate, after which the precursor circuit-pattern is heated to form a circuit pattern on the circuit pattern holding substrate.

According to another aspect of the present invention for attaining the above-described objects, in a circuit pattern formation device for forming a precursor circuit-pattern in a surface of a member in advance and forming a circuit pattern onto a target substrate from this member, the circuit pattern formation device includes: a unit for preparing a pattern on an upper surface of the member; a unit for supplying a conductive particle dispersion solution to this pattern to form the precursor circuit-pattern; a unit for energizing a circuit pattern holding substrate, in which an adhesive layer is formed, to thereby temporarily transfer the precursor circuit-pattern formed in the member; a unit for heating the transferred circuit pattern to form a circuit pattern; and a unit for releasing the circuit pattern and the adhesive layer from the circuit pattern holding substrate to thereby transfer the same to a target substrate.

According to yet another aspect of the present invention for attaining the above-described objects, in a circuit pattern formation method to a substrate for forming a circuit pattern on a target substrate using a conductive material, the method includes steps of: forming a precursor circuit-pattern from the conductive material in advance; temporarily holding the precursor circuit-pattern in a surface of an adhesive layer formed in an upper surface of a conductive base layer of a circuit pattern holding substrate; then preparing a circuit pattern by heating the precursor circuit-pattern; and transferring the prepared circuit pattern and the adhesive layer to a target substrate.

In this case, it is preferable that when temporarily holding the precursor circuit-pattern in the surface of the adhesive layer of the circuit pattern holding substrate, the conductive material is patterned in the surface of the adhesive layer, or the precursor circuit-pattern, which is prepared in advance, is transferred to the surface of the adhesive layer. Moreover, in this case, when forming the precursor circuit-pattern from the conductive material in advance and temporarily holding the precursor circuit-pattern in the surface of the adhesive layer of the circuit pattern holding substrate, an electrostatic latent image is formed in the surface of the dielectric thin film, and then a conductive particle dispersion solution is supplied to this dielectric thin film, and the electrostatic latent image is developed by a conductive particle to form the precursor circuit-pattern, and the precursor circuit-pattern formed on a dielectric thin film is transferred to the surface of the adhesive layer of the circuit pattern holding substrate by an electrostatic force. It is further preferable that when temporarily holding the precursor circuit-pattern in the circuit pattern holding substrate, a voltage is applied to a conductive layer which this holding substrate has.

In this case, it is preferable that when forming the precursor circuit-pattern from the conductive material, at least one of ink jet printing, a dispenser method, screen printing, relief printing, intaglio printing (gravure) printing, and lithographic (flexographic) printing, is used to form. It is preferable that the conductive material is a conductive particle dispersion solution made by dispersing a conductive particle into a liquid, the conductive particle being made conductive by heating or pressuring, and that the particle diameter of the conductive particle dispersed into the conductive particle dispersion solution is set to less than or equal to 100 nm. It is further preferable that the conductive particle in the conductive particle dispersion solution has an ionic organic molecule on its surface and is dispersed into a nonpolar solvent.

In this case, it is preferable that when transferring the circuit pattern from the circuit pattern holding substrate to the target substrate, a base material, which the circuit pattern holding substrate has, is released after the circuit pattern is adhered to the target substrate, and it is preferable that the circuit pattern holding substrate includes a conductive base layer on the base material and peels off so that a released plane may be an interface between the base material of the circuit pattern holding substrate and the conductive base layer, or an interface between the conductive base layer and the adhesive layer. It is further preferable that the adhesive layer includes a thermosetting resin that is cured by heating.

EXAMPLES

Figure 1:
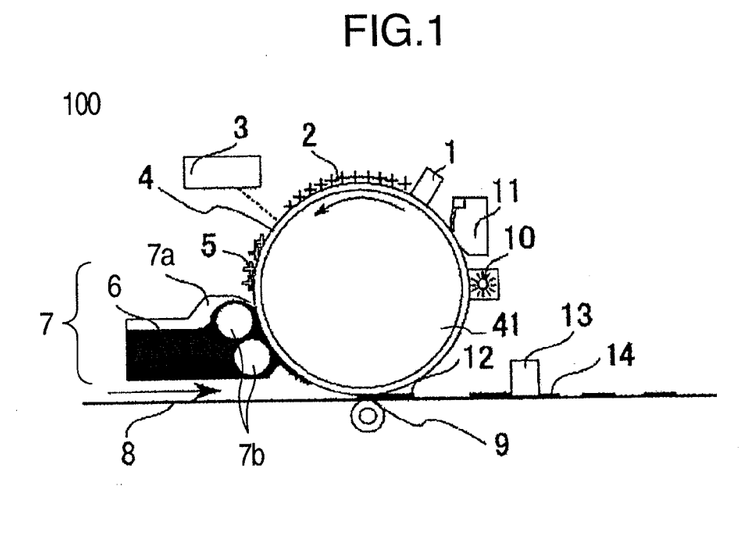
FIG. 1 is a schematic view of an example of a circuit pattern formation method concerning the present invention.

Hereinafter, an example of the circuit pattern formation method concerning the present invention will be described using the accompanying drawings. In the present example, a case where a circuit pattern is formed in a circuit pattern holding substrate by electrophotography will be described as an example. FIG. 1 schematically shows a circuit pattern formation device for forming a circuit pattern by electrophotography. In a circuit pattern formation device 100, a dielectric thin film body 4 is attached to an outer peripheral surface of a cylindrical drum 41. The cylindrical drum 41 is rotatably disposed with the axial center being set horizontal. Beneath the cylindrical drum 41, a plurality of conveying rollers 9 are rotatably spaced from each other. On the conveying roller 9 is placed a circuit pattern holding substrate 8, which is sent out by the conveying rollers 9 from the left to the right in the view.

Diagonally above the drum 41 disposed along the horizontal axis, a charging device 1 is disposed a slight distance apart from this drum 41. At the rotation direction side of the drum 41 rather than this charging device 1 side and at the outward side of the drum 41, an exposure unit 3 is disposed a distance apart from this charging device 1. At the rotation direction side of the drum 41 rather than the exposure unit 3 side and near the advancing side to the conveying roller 9 of the circuit pattern holding substrate 8, a development apparatus 7 is disposed a slight distance apart from the drum 41. The development apparatus 7 includes a tank 7a for storing a conductive particle dispersion solution 6, and a small drum 7b for supplying the conductive particle dispersion solution 6 stored in the tank 7a to the dielectric thin film body 4 that is wound around the drum 41. The small drum 7b is rotatably disposed in the tank 7a with the axial center being set horizontal, and a layer of the conductive particle dispersion solution 6 is formed on this small drum 7b.

Here, in the storage tank 7a, a non-illustrated concentration detecting unit for detecting the concentration of the conductive particle dispersion solution 6 and a non-illustrated concentration adjusting unit are provided. In the storage tank 7a, although not illustrated either, an anti-settling means and a means for equalizing the concentration over the whole region are provided. As the anti-settling means or the means for equalizing the concentration over the whole region, any one of an ultrasonic irradiation unit, a stirring unit for stirring the conductive particle dispersion solution 6 stored in the storage tank 7a, and a unit for vibrating the storage tank 7a itself, is used.

At the anti-rotation direction side of the charging device 1, a residual conductive particle cleaning device 11 is disposed adjacent to the charging device 1 and a slight distance apart from the drum 41. Then, adjacent to this residual conductive particle cleaning device 11 and at a location almost just beside the drum 41, a residual latent image erasing device 10 is disposed a slight distance apart from the drum 41. At the location just beneath the drum 41, one of the conveying rollers 9 described above is disposed. At a location of sandwiching the circuit pattern holding substrate 8 with respect to this conveying roller 9 and beneath the drum 41, a transfer unit is disposed. At the downstream side of the conveying direction of the circuit pattern holding substrate 8 and above the circuit pattern holding substrate 8, a heater 13 is disposed.

The operation of the circuit pattern formation device 100 of the electrophotographic method configured this way will be described below. The surface of the photosensitive dielectric thin film body 4 wound around the drum 4 is uniformly charged by the charging device 1 to thereby prepare the electrostatic latent image 2. Here, as the charging device 1, a device causing at least one of corotron charging, roller contact charging, and brush contact charging to occur is used.

The exposure unit 3 scans and irradiates a laser beam to the surface of the dielectric thin film body 4, in which the electrostatic latent image 2 is prepared, based on an image signal outputted from an image information processor, such as a non-illustrated personal computer. An electrostatic latent image pattern 5 is formed in the surface of the dielectric thin film body 4, the surface being irradiated with the laser beam. By rotatably driving the small drum 7b of the development apparatus 7, a layer of the conductive particle dispersion solution 6 is caused to contact with the formed electrostatic latent image pattern 5, thereby developing and forming a circuit pattern and obtaining a precursor circuit-pattern 12. At this time, the concentration adjusting unit adjusts the concentration of the conductive particle dispersing solution 6 by adding a nonpolar solvent 15 or a conductive particle 17 based on the concentration information of the conductive particle dispersing solution 6, which the non-illustrated concentration detecting unit provided in the storage tank 7a detected.

The precursor circuit-pattern 12, which is developed and formed in the surface of the dielectric thin film body 4, is transferred onto the circuit pattern holding substrate 8 by the transfer unit and is held temporarily. The transfer unit applies a voltage from the back side via the precursor circuit-pattern, the precursor circuit-pattern being a layer to be transferred, and transfers the precursor circuit-pattern 12, which was developed on the dielectric thin film body 4 by an electrostatic force, onto the circuit pattern holding substrate 8.

In transferring, the precursor circuit-pattern 12 is held in an adhesive layer 22 of the circuit pattern holding substrate 8, which will be described in detail later. Then, by the use of the heater 13, the precursor circuit-pattern 12 is heated at a high temperature of 150° C. to 250° C. or more to be conductive, thereby forming a circuit pattern 14. Then, the circuit pattern 14 formed on the circuit pattern holding substrate 8 is transferred to an object substrate by the non-illustrated transfer unit.

Figure 2:
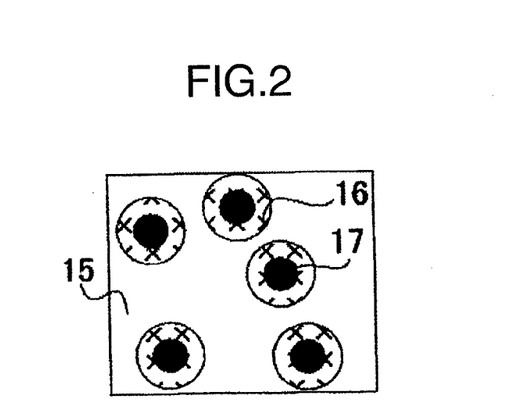
FIG. 2 is a schematic view of a particle dispersion solution used for the circuit pattern formation method shown in FIG. 1.

The details of the conductive particle dispersion solution 6 used in the present example, which is configured and operates as described above, will be described using a schematic view shown in FIG. 2. The particle dispersion solution 6 is prepared by dispersing the conductive particle 17 of the particle diameter of 100 nm or less into the nonpolar solvent 15, the conductive particle 17 having an ionic organic molecule 16 adsorbed to the surface thereof.

Here, in case of using a polymer material for the ionic organic molecule 16, monopolymers of styrene or its substitute, such as polystyrene or poly-p-chlorostyrene, polyvinyl toluene, styrene-p-chlorostyrene copolymer, or styrene-vinyltoluene copolymer, or copolymers of these; copolymers of styrene and acrylic ester, such as styrene methyl acrylate copolymer, styrene ethyl acrylate copolymer, and styrene acrylic acid-n-butyl copolymer; copolymers of styrene and methacrylic acid ester, such as styrene-methyl methacrylate copolymer, styrene-ethyl methacrylate copolymer, and styrene-methacrylic acid-n-butyl copolymer; styrene system copolymers of styrene and other vinyl system monomer, such as multi-component copolymer of styrene, acrylic ester, and methacrylic acid ester, styrene-acrylonitrile copolymer, styrene-vinylmethyl ether copolymer, styrene-butadiene copolymer, styrene-vinyl methyl ketone copolymer, styrene-maleate copolymer; methacrylic ester resins, such as polymethylmethacrylate and poly butylmethacrylate; acrylic ester resins, such as polymethyl acrylate, ethyl polyacrylate, and butyl polyacrylate; and materials with functional groups capable of providing the ionicity of a carboxylic acid group, an amino acid group, and the like to a single polymer resin or a compounded polymer resin of polyester resin, epoxy resin, and cycloolefin copolymer, can be used.

In case of using a low molecular-weight organic molecule, dicarboxylic acids, such as an oxalic acid or a malonic acid, a succinic acid, an adipic acid, a glutaric acid, a 2,4-diethylglutaric acid, a 2,4-diethylglutaric acid, a pimelic acid, an azelaic acid, a sebacic acid, a cyclohexanedicarboxylic acid, a maleic acid, a fumaric acid, and a diglycolic acid; fatty acids, such as a caprylic acid, a lauryl acid, a myristic acid, a palmitic acid, a stearin acid, an arachin acid, a behenic acid, a linolic acid, an oleic acid, and a linolenic acid; hydroxycarboxylic acids, such as a lactic acid, a hydroxypyruvic acid, a dimethylol propionic acid, a citric acid, a malic acid, and a glyceric acid; and aliphatic carboxylic acid mineral salts composed of an aliphatic carboxylic acid ion by an aliphatic carboxylic acid, such as this hydroxycarboxylic acid, and an inorganic ion of Ag, Cu, Au, Pd, Pt and Ni, W, Mo, Cr or the like, are used.

Figure 3:
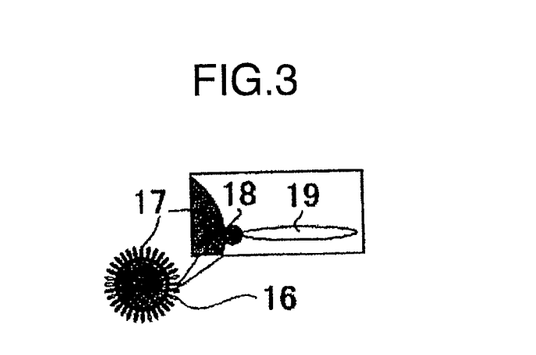
FIG. 3 is a schematic view of a conductive particle having a low molecular-weight ionic organic molecule.

In addition, in FIG. 3, reference numeral 19 represents the above-described aliphatic carboxylic acid ion, and reference numeral 18 represents an inorganic ion. When preparing a particle dispersion solution, the proportion of an organic molecule component in the circuit pattern 14 is lowered in order to decrease the resistance. Moreover, even if the circuit pattern holding substrate 8 is a resin substrate made of polyimide and the like, a low molecular-weight organic molecule as shown in FIG. 3 is used so as to be able to form the circuit pattern 14 in the surface thereof by low temperature burning.

The organic constituent around the conductive particle needs to be heated and burned out in order to make the precursor circuit-pattern conductive. Here, the low molecular component may consume less thermal energy required for burning than the high molecular component consumes. Then, the use of a low molecular organic molecule with a low burning temperature allows for use of a substrate made of a resin, such as polyimide, having a low heat resistance temperature. The pattern being made conductive has high resistance because the proportion of the residual organic molecules in the conductor pattern is high. However, the use of a low molecular organic molecule allows this proportion to be reduced.

The particle diameter of the conductive particle 17 is set to less than or equal to 10 mm so as to allow for low temperature fusing and so that the circuit pattern 14 has high resolution. However, in order to heat and fuse the conductive particles at a temperature of 200° C. or less and thus to make the precursor circuit-pattern conductive, the particle diameter of the conductive particle 17 is set to less than or equal to 10 nm. When the circuit pattern 14 with the line width of 100 nm or less is required, the particle diameter of the conductive particles 17 is set to less than or equal to 5 nm.

For the conductive particle 17, a single metal, such as Ag or Cu, Au, Pd, Pt, Ni, W, Mo, or Cr, or the oxides of these metals, or the alloys of these metals are used. When a conductive material is needed, Ag or Cu having a low volume resistivity is used. In addition, a plurality of above-described metals or its oxides, or its alloys can be mixed for use. An aliphatic hydrocarbon system solvent is used for the nonpolar solvent 15. Aliphatic hydrocarbon system solvents include isoparaffin system ones or petroleum naphtha system ones, Isobar (Exxon Mobil Corporation), IP solvent (Idemitsu Petroleum Co., Ltd.), Soltol (Philips Petroleum Co.), and other hydrocarbons.

Figure 4:
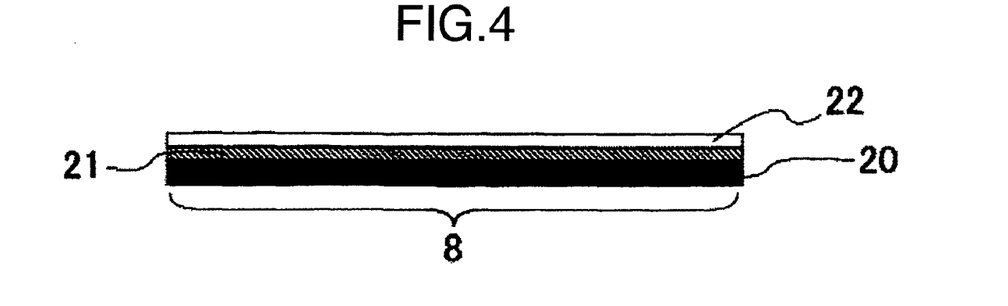
FIG. 4 is a vertical cross-sectional view of a circuit pattern holding substrate used for the circuit pattern formation method shown in FIG. 1.

Next, the details of the circuit pattern holding substrate 8 used in the present example will be described using FIG. 4. FIG. 4 is a vertical cross-sectional view of the circuit pattern holding substrate 8. In the circuit pattern holding substrate 8, a conductive base layer 21 is formed in the upper surface of a base substrate 20, and in the further upper surface of this conductive base layer 21 the adhesive layer 22 is formed.

The conductive base layer 21 is used for the purpose of applying a voltage when the precursor circuit-pattern 12 developed on the dielectric thin film body 4 by an electrostatic force is transferred onto the circuit pattern holding substrate 8. For this reason, a material having a sufficient conductivity is used for the conductive base layer 21. For the conductive base layer 21, a single metal, such as Ag or Cu, Au, Pd, Pt, Ni, W, Mo, or Cr, or the oxides of these metals, or the alloys of these metals, the ones made by dispersing the conductive particles of the above-described inorganic component or a carbon black into a resin, or conductive polymers, such as polyacethylene, poly-p-phenylene, and polypyrrole, are used.

However, because the conductive base layer 21 also undergoes a burning step of heating at about 150° C. to 250° C., a material having heat resistance to about 150° C. to 250° C. is employed. In the present example, inorganic materials, such as Ag or Cu, Au, Pd, Pt, Ni, W, Mo, and Cr, were used. Among these inorganic materials, Cu and Ag having low conductivity produced good results.

The adhesive layer 22 is formed for the purpose of holding the precursor circuit-pattern 12. After the circuit pattern holding substrate 8 is heated using the heater 13, the adhesive layer 22 is cured to adheringly hold the circuit pattern 14, which was formed by the precursor circuit-pattern 12 being made conductive. The adhesive layer 22 also prevents the circuit pattern 14 from peeling off from the circuit pattern holding substrate 8.

As the adhesive layer 22, a thermosetting resin, which is cured to provide adhesive properties by heating, is used. If the thermosetting resin is used for the adhesive layer 22, the precursor circuit-pattern 12 becomes conductive and at the same time the adhesive layer 22 starts to exhibit adhesive properties when the precursor circuit-pattern 12 is heated and burned, thereby improving the adhesive properties between the circuit pattern 14 and the circuit pattern holding substrate 8. As a result, when the circuit pattern 14 is transferred from the circuit pattern holding substrate 8 to a target substrate, as described later, it is possible to prevent the circuit pattern 14 from peeling off from the adhesive layer 22, or from disconnecting.

As the thermosetting resin, an epoxy resin or a phenol resin, a polyimide resin, a polyamide resin, and a polyamide imide resin are used, for example. Alternatively, a plurality of these resin materials are combined for use. In the present example, a thermosetting resin, which is excellent in adhesive properties and toughness, heat resistance, electric insulation, and corrosion resistance, is supposed to be used and an epoxy resin was used. A curing agent is added to the adhesive layer 22 so that the curing of the adhesive layer 22 is promoted when heated.

The adhesive layer 22 is prepared by applying a spray over the conductive base layer 21, or by coating by the use of a slit coater or a roll coater. If a pattern-wise coating is carried out by using offset printing, screen printing, ink jet method, a dispenser method, and the like, the adhesive material is applied only to a region in which the wiring is to be formed, or to the periphery thereof, thus allowing less coating material to be used.

In addition, before the adhesive layer 22 is heated, the precursor circuit-pattern 12 is temporarily formed in the adhesive layer 22, the precursor circuit-pattern 12 being in a state that the conductive particles 17 are just condensed. For this reason, if the thickness of the adhesive layer 22 is too thick, the conductive particles 17 might diffuse into the not-yet-cured adhesive layer 22 and the adhesive layer 22 might remain in a not-yet-conductive state, thereby degrading the resolution. Then, the film thickness of the adhesive layer 22 is set to less than or equal to 100 μm. When a pattern of 10 μm or less is formed, this film thickness is set to less than or equal to 10 μm.

Incidentally, in the present example, a sheet shaped substrate is used for the circuit pattern holding substrate 8 in view of ease of conveying during the continuous manufacturing and the heating efficiency, the adhesion/transfer to a target substrate 23 described below, and a releasing step from the base substrate 20. Moreover, in order to facilitate release of the base substrate 20 when transferring the circuit pattern 14 to a target substrate, a release layer is provided in the following portion so that when only the base substrate 20 is released, a portion between the base material 20 and the conductive base layers 21 can be released, and when the base substrate 20 and conductive base layer 21 are released altogether, a portion between the conductive base layer 21 and the adhesive layers 22 can be released. A fluorocarbon-type resin or a silicon resin is used for the release layer.

Figure 5:
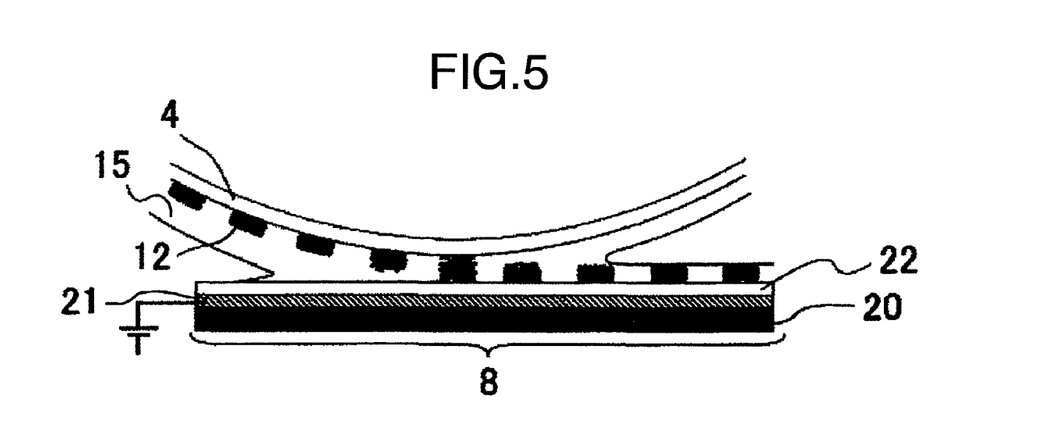
FIG. 5 is a view explaining an electrostatic transferring step.

The details of the steps after the step of applying the conductive particle dispersion solution 6 to the dielectric thin film body 4 to form the precursor circuit-pattern 12 will be described using FIGS. 5 to 9. FIGS. 5 to 9 are vertical cross-sectional views of the circuit pattern holding substrate 8 and/or the target substrate 23. FIG. 5 is a view showing a situation in which the precursor circuit-pattern 12 formed in the surface of the dielectric thin film body 4 wound around the rotating drum 41 is transferred to the circuit pattern holding substrate 8. A transfer voltage is applied to the conductive base layer 21 when transferring the precursor circuit-pattern 12 to the circuit pattern holding substrate 8. Because the precursor circuit-pattern 12 developed on the dielectric thin film body 4 is used for the electrostatic transfer, wherein only the adhesive layer 22 exists therebetween, a transfer bias to be applied can be minimized. Moreover, because the applied voltage is small, a fracture of the image can be prevented during transferring.

Figure 6:
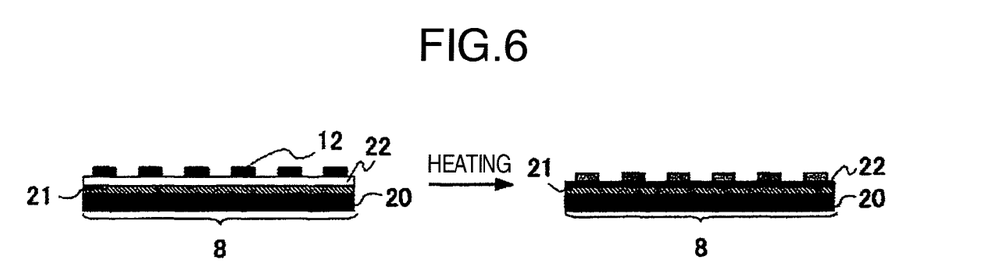
FIG. 6 is a view explaining a heating and burning step.

Next, FIG. 6 shows a situation in which the precursor circuit-pattern held in the circuit pattern holding substrate 8 is heated and burned. When the precursor circuit-pattern 12 is burned to form the circuit pattern 14, the heater 13 fuses the conductive particles 17 to each other to be conductive. Moreover, the ionic organic molecule 16 in the surface of the conductive particle 17 is burned. The adhesive layer 22 of the circuit pattern holding substrate 8 is heated by the heater 13, so that the adhesive layer 22 on the circuit pattern holding substrate 8 is cured, thereby improving the adhesion to the circuit pattern 14, which is the precursor circuit-pattern 12 converted by heating. At this time, a non-illustrated pressurizing unit presses the precursor circuit-pattern 12 onto the circuit pattern holding substrate 8 at the same time of heating.

The heating temperature at the time of heating is set to a temperature at which temperature the conductive particles 17 are sufficiently fused to each other and the ionic organic molecule 16 is burned. Specifically, the heating temperature is set to less than or equal to 300° C. at which temperature the adhesive layer 22 can be cured, high adhesion to the circuit pattern 14 is obtained, and also the deformation and denaturation of the circuit pattern holding substrate 8 can be prevented. Here, the heater 13 is provided with an exhaust unit for exhausting the burned organic material components.

Figure 7:
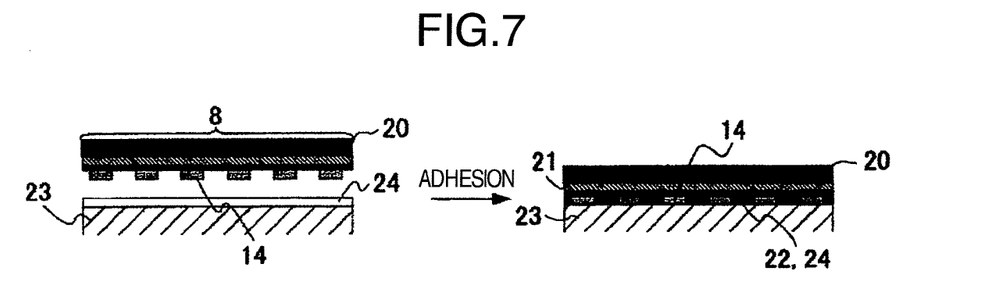
FIG. 7 is a view explaining an adhering step.

FIG. 7 shows a situation in which the circuit pattern 14 formed on the circuit pattern holding substrate 8 is stuck onto the target substrate 23 having an adhesive agent 24. The top and bottom of the circuit pattern holding substrate 8 are reversed to dispose, and under this circuit pattern holding substrate 8 the target substrate 23 is positioned with the surface, in which the adhesive agent 24 is provided, being the upper surface. The circuit pattern holding substrate 8 is pressed against the target substrate 23 at a predetermined pressure for a predetermined time, to be adhered.

Because in this step, a high temperature heating step required when making the precursor circuit-pattern 12 conductive is not required, it is possible to transfer from the circuit pattern holding substrate 8 to the target substrate 23 easily even if the heat resistance of the target substrate 23 is poor. Here, for the adhesive agent 24, a material having predetermined adhesive properties, heat resistance, electric insulation, and corrosion resistance even after forming the circuit pattern 14 is used. Because the adhesive layers 22, 24 are formed in the upper surface side and in the lower surface side of the transferred circuit pattern 14, the adhesion is sufficient and the delamination and disconnection can be prevented. In addition, even if silver is used as the material of the circuit pattern 14, the migration of concern in the silver wiring can be prevented.

Figure 8:
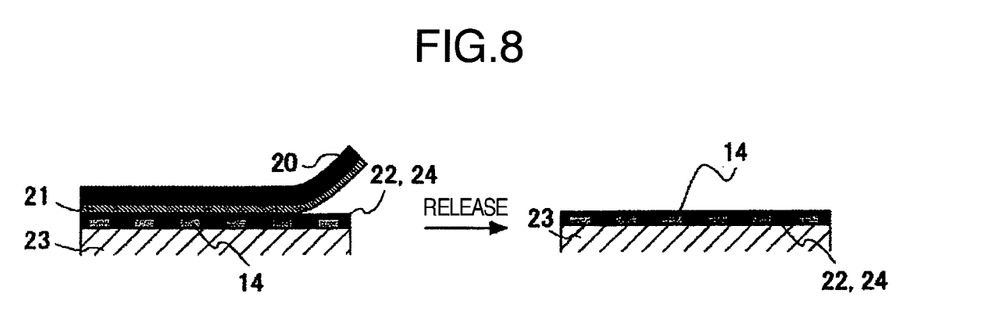
FIG. 8 is a view explaining a releasing step.
Figure 9:
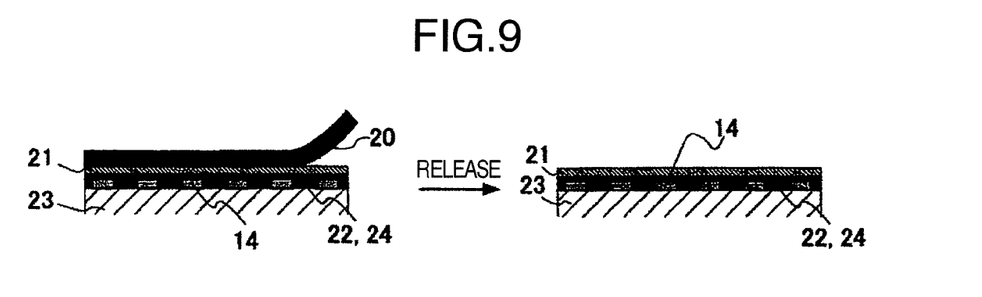
FIG. 9 is a view explaining a releasing step.

FIG. 8 and FIG. 9 show a situation in which the base material 20 of the circuit pattern holding substrate 8, which becomes unnecessary after adhering and transferring the circuit pattern 14 onto the target substrate 23, is released from the target substrate 23. FIG. 8 shows the case where the conductive base layer 21 formed in the surface of the base substrate 20 is released together with the base substrate 20 of the circuit pattern holding substrate 8, and FIG. 9 shows the case where only the base substrate 20 is released. In the method shown in FIG. 8, because only the circuit pattern 14, which was transferred together with the adhesive layer 22 onto the target substrate 23, will remain, the circuit pattern 14 can be formed in multilayer if a series of the above-described steps are repeated, thereby allowing a multilayer interconnection board to be formed. In the method shown in FIG. 9, because only the base substrate 20 is released and the conductive base layer 21 will remain, this conductive base layer 21 can be used for a ground layer, an anti-electromagnetic wave layer, and the like.

Although in the above-described example a uniformly charged electrostatic latent image is exposed to form the electrostatic latent image pattern, a method also can be used, in which the electrostatic latent image 3 is formed by stamp charging, wherein an electrostatic charge is provided to a convex portion, which is formed in advance by processing a desired pattern shape in an electrostatic latent image transfer body, and then this convex portion is contacted with the surface of the dielectric thin film body 4. However, for changes of the electrostatic latent image pattern 5, the method shown in the present example is easier. In either method, for the electrostatic latent image to be formed, either one of a positive charge and a negative charge can be used.

Moreover, although in the present example the conductive particle dispersion solution 6 is formed in the surface of the drum 7b, and is contacted and supplied to the dielectric thin film body 4 by rotationally driving the drum 7b, a method of spraying the conductive particle dispersion solution 6 from a nozzle, or a method of dipping the dielectric thin film body 4, in which the electrostatic latent image pattern 5 is formed, into the storage tank 7a for storing the conductive particle dispersion solution 6, can be also used.

In addition, the formation of the circuit pattern 14 using the circuit pattern holding substrate 8 as shown in the above-described example will facilitate the pattern changes. Although in the above-described example the electrophotographic method, which is advantageous in reliability, high resolution, and productivity, was described as an example, the method of patterning the circuit pattern holding substrate 8 is not limited to the electrophotographic method, and patterning methods, such as a relief printing method, an intaglio printing (gravure) printing method, a planographic plate (flexographic) printing method, a screen printing method, a nano imprint method, an ink jet printing method, a dispenser method, and the like, can be used, and two or more methods among these patterning methods including the electrophotographic method can be also used simultaneously.

The circuit pattern 14 formed using the conductive particle dispersion solution 6 shown in the above-described example can be used for the substrates used for, e.g., a personal computer, a large computer, a notebook computer, a pen-input type personal computer, a notebook type word processor, a mobile phone, a portable card, a wrist watch, a camera, an electric shaver, a cordless telephone, a fax, a video tape recorder, a video camera, an electronic notebook, a calculator, an electronic notebook with a telecommunication function, a portable copy machine, a liquid crystal television, a power tool, a vacuum cleaner, a game machine having functions such as a virtual reality, a toy, an electromotive bicycle, an auxiliary walking device for medical care, a wheelchair for medical care, a portable bed for medical care, an escalator, an elevator, a forklift, a golf cart, a backup power, a load conditioner, a stationary energy storage system, and the like. Other than these, it can be used also for munitions and space applications.

It should be further understood by those skilled in the art that although the foregoing description has been made on embodiments of the invention, the invention is not limited thereto and various changes and modifications may be made without departing from the spirit of the invention and the scope of the appended claims.

ADVANTAGES OF THE INVENTION

According to the present invention, an adhesion strength between the circuit pattern and the substrate can be improved without increasing the resistance value of the obtained circuit pattern. In particular, in the electrophotographic method, the applied voltage can be reduced and the circuit pattern can be transferred highly efficiently and with high resolution. Moreover, the formation of the circuit pattern using the circuit pattern holding substrate allows the circuit pattern to be formed even in a poorly heat resistant substrate.

The invention claimed is:

1. A circuit pattern formation method for forming a circuit pattern onto a target substrate from a member provided with a precursor circuit-pattern in advance, the circuit pattern formation method comprising:
temporally transferring the precursor circuit-pattern in the member to a circuit pattern holding substrate provided with an adhesive layer including a thermosetting resin in an upper surface thereof,
then burning the precursor circuit-pattern and heating the adhesive layer to make the precursor circuit-pattern conductive and at the same time to cure the adhesive layer, and
then transferring the conductive circuit-pattern and the cured adhesive layer from the circuit pattern holding substrate to a surface of another adhesive layer, which is provided is advance on a target substrate.

2. The method of forming a circuit pattern to a substrate according to claim 1,
wherein forming the precursor circuit-pattern includes steps of:
supplying a conductive particle dispersion solution to the member being a dielectric thin film body to form the precursor circuit-pattern,
energizing the circuit pattern holding substrate to transfer the formed precursor circuit-pattern, the circuit pattern holding substrate including a base material, a conductive base layer in an upper surface of this base material, and an adhesive layer in an upper surface of this conductive base layer, and
heating the transferred precursor circuit-pattern to form a circuit pattern on the circuit pattern holding substrate.

3. A circuit pattern formation method to a substrate for forming a circuit pattern on a target substrate using a conductive material, the circuit pattern formation method comprising:
forming a precursor circuit-pattern from the conductive material in advance;
temporarily holding the precursor circuit-pattern in a surface of an adhesive layer, including a thermosetting resin, formed in an upper surface of a conductive base layer of a circuit pattern holding substrate;
then preparing a circuit pattern by heating the precursor circuit-pattern; and
transferring the prepared circuit pattern and the adhesive layer to a surface of another adhesive layer which is provided in advance on the target substrate.

4. The circuit pattern formation method to a substrate according to claim 3, wherein when temporarily holding the precursor circuit-pattern in the surface of the adhesive layer of the circuit pattern holding substrate, the conductive material is patterned in the surface of the adhesive layer, or the precursor circuit-pattern, which is prepared in advance, is transferred to the surface of the adhesive layer.

5. The circuit pattern formation method to a substrate according to claim 3, wherein when forming the precursor circuit-pattern from the conductive material in advance and temporarily holding the precursor circuit-pattern in the surface of the adhesive layer of the circuit pattern holding substrate, an electrostatic latent image is formed in a surface of a dielectric thin film, and then a conductive particle dispersion solution is supplied to this dielectric thin film, and the electrostatic latent image is developed by the conductive particle to form the precursor circuit-pattern, and the precursor circuit-pattern formed on the dielectric thin film is transferred to the surface of the adhesive layer of the circuit pattern holding substrate by an electrostatic force.

6. The circuit pattern formation method to a substrate according to claim 5, wherein when temporarily holding the precursor circuit-pattern in the circuit pattern holding substrate, a voltage is applied to a conductive layer which this holding substrate has.

7. The circuit pattern formation method to a substrate according to claim 5, wherein when forming the precursor circuit-pattern from the conductive material, at least one of ink jet printing, a dispenser method, screen printing, relief printing, intaglio printing (gravure) printing, and lithographic (flexographic) printing, is used to form.

8. The circuit pattern formation method to a substrate according to claim 5, wherein the conductive material is a conductive particle dispersion solution made by dispersing a conductive particle into a liquid, the conductive particle being made conductive by heating or pressuring.

9. The circuit pattern formation method to a substrate according to claim 8, wherein the particle diameter of the conductive particle dispersed into the conductive particle dispersion solution is set to less than or equal to 100 nm.

10. The circuit pattern formation method to a substrate according to claim 8, wherein the conductive particle in the conductive particle dispersion solution has an ionic organic molecule on its surface and is dispersed in a nonpolar solvent.

11. The circuit pattern formation method to a substrate according to claim 3, wherein when transferring the circuit pattern from the circuit pattern holding substrate to the target substrate, a base material, which the circuit pattern holding substrate has, is released after the circuit pattern is adhered to the target substrate.

12. The circuit pattern formation method to a substrate according to claim 11, wherein the circuit pattern holding substrate includes a conductive base layer on the base material and peels off so that a released plane may be an interface between the base material of the circuit pattern holding substrate and the conductive base layer, or an interface between the conductive base layer and the adhesive layer.

13. The circuit pattern formation method to a substrate according to any one of claims 3 to 12, wherein the adhesive layer includes a thermosetting resin that is cured by heating.

* * * * *